United States Patent
Chappaz et al.

(10) Patent No.: US 9,201,528 B2
(45) Date of Patent: Dec. 1, 2015

(54) METHOD OF MANUFACTURING A VIBRATORY ACTUATOR FOR A TOUCH PANEL WITH HAPTIC FEEDBACK

(75) Inventors: Cedrick Chappaz, Pontcharra (FR); Pascal Ancey, Revel (FR); Yves Gilot, Saint Egreve (FR); Serge Laffont, Fontaine (FR); Olivier Girard, Saint Egreve (FR)

(73) Assignees: STMicroelectronics SA, Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 188 days.

(21) Appl. No.: 13/490,347

(22) Filed: Jun. 6, 2012

(65) Prior Publication Data

US 2012/0313874 A1     Dec. 13, 2012

(30) Foreign Application Priority Data

Jun. 7, 2011 (FR) .................................. 11 54936
Jun. 7, 2011 (FR) .................................. 11 54943

(51) Int. Cl.
G06F 3/041 (2006.01)
G08B 6/00 (2006.01)
H01L 41/08 (2006.01)
H01L 41/318 (2013.01)
G06F 3/01 (2006.01)

(52) U.S. Cl.
CPC .............. *G06F 3/041* (2013.01); *G06F 3/016* (2013.01); *G08B 6/00* (2013.01); *H01L 41/0805* (2013.01); *H01L 41/318* (2013.01); *Y10T 29/42* (2015.01); *Y10T 29/49155* (2015.01); *Y10T 29/49165* (2015.01)

(58) Field of Classification Search
CPC ...... G08B 6/00; H01L 41/22; H01L 41/0805; H01L 41/318
See application file for complete search history.

(56) References Cited

U.S. PATENT DOCUMENTS 6,816,049 B2 * 11/2004 Watanabe et al. ............. 335/222
6,937,124 B1 * 8/2005 Nakamura et al. ............ 335/222
7,605,523 B2 * 10/2009 Katsuki et al. ................ 310/363

(Continued)

FOREIGN PATENT DOCUMENTS

EP   1-544-720 A1   6/2005
EP   1-956-466 A1   8/2008

(Continued)

OTHER PUBLICATIONS

Dana et al., "Thin film piezoelectric vibrator panel," *IBM Technical Disclosure Bulletin* 34(3):132-134, Aug. 1991, International Business Machines Corp., Armonk, NY, XP000210473.

(Continued)

*Primary Examiner* — Kumar Patel
*Assistant Examiner* — Afroza Chowdhury
(74) *Attorney, Agent, or Firm* — Seed IP Law Group PLLC

(57) ABSTRACT

The disclosure relates to a method of manufacturing vibratory elements, comprising forming on a substrate a multilayer structure by an integrated circuit manufacturing method, the multilayer structure comprising an element susceptible of vibrating when it is subjected to an electrical signal, and electrodes for transmitting an electrical signal to the vibratory element, the vibratory element comprising a mechanical coupling face that is able to transmit to control element vibrations perceptible by a user.

42 Claims, 7 Drawing Sheets

(56) References Cited

U.S. PATENT DOCUMENTS

| | | | |
|---|---|---|---|
| 7,663,604 B2* | 2/2010 | Maruyama et al. | 345/173 |
| 8,156,809 B2* | 4/2012 | Tierling et al. | 73/579 |
| 8,179,022 B2* | 5/2012 | Murata | 310/348 |
| 8,306,500 B2 | 11/2012 | Tho et al. | |
| 8,416,027 B2* | 4/2013 | Takizawa | 331/156 |
| 8,547,333 B2 | 10/2013 | Pasquero et al. | |
| 8,593,409 B1 | 11/2013 | Heubel et al. | |
| 8,760,413 B2 | 6/2014 | Peterson et al. | |
| 2002/0149561 A1 | 10/2002 | Fukumoto et al. | |
| 2003/0067449 A1* | 4/2003 | Yoshikawa et al. | 345/173 |
| 2006/0097996 A1* | 5/2006 | Tabata | 345/173 |
| 2006/0132000 A1 | 6/2006 | Katsuki et al. | |
| 2006/0181522 A1* | 8/2006 | Nishimura et al. | 345/177 |
| 2007/0080951 A1* | 4/2007 | Maruyama et al. | 345/173 |
| 2007/0236450 A1 | 10/2007 | Colgate et al. | |
| 2008/0122315 A1 | 5/2008 | Maruyama et al. | |
| 2009/0115005 A1* | 5/2009 | Watanabe | 257/415 |
| 2010/0102671 A1* | 4/2010 | Murata | 310/314 |
| 2010/0321330 A1 | 12/2010 | Lim et al. | |
| 2011/0115340 A1 | 5/2011 | Lee | |
| 2011/0134082 A1* | 6/2011 | Mitsuhashi et al. | 345/177 |
| 2011/0227657 A1* | 9/2011 | Nishizawa et al. | 331/156 |
| 2012/0068835 A1 | 3/2012 | Li | |
| 2012/0086651 A1* | 4/2012 | Kwon et al. | 345/173 |
| 2012/0126941 A1* | 5/2012 | Coggill | 340/5.54 |
| 2012/0139851 A1* | 6/2012 | Kim et al. | 345/173 |
| 2012/0162143 A1* | 6/2012 | Kai et al. | 345/177 |
| 2012/0256848 A1 | 10/2012 | Madabusi Srinivasan | |
| 2012/0313766 A1* | 12/2012 | Chappaz et al. | 340/407.1 |
| 2013/0271412 A1 | 10/2013 | Adachi et al. | |
| 2014/0333564 A1 | 11/2014 | Hong et al. | |

FOREIGN PATENT DOCUMENTS

| | | |
|---|---|---|
| EP | 2-202-619 A1 | 6/2010 |
| WO | 2010/054014 A1 | 5/2010 |

OTHER PUBLICATIONS

Sergeant et al., "Geometric optimization of an ultrasonic tactile plate," *Sensors and Actuators A* 161:91-100, 2010.

* cited by examiner

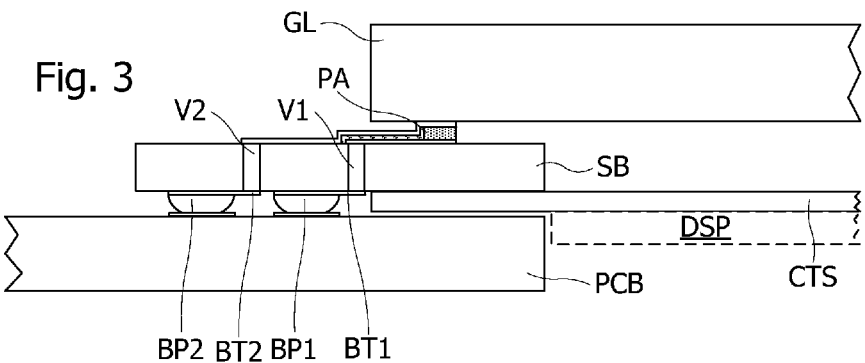
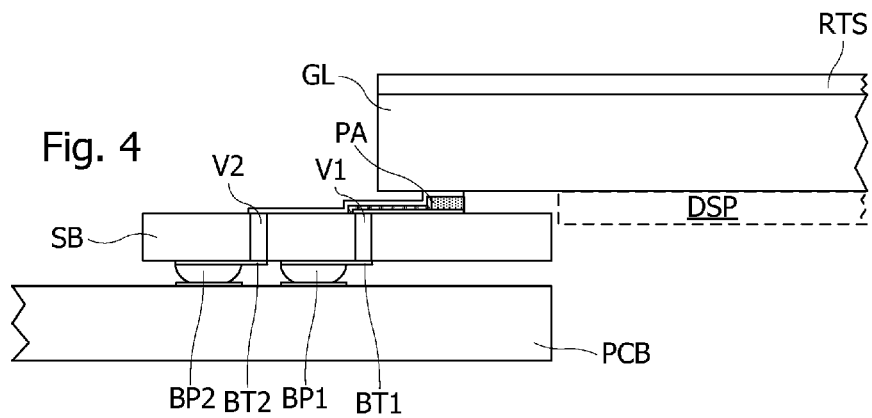
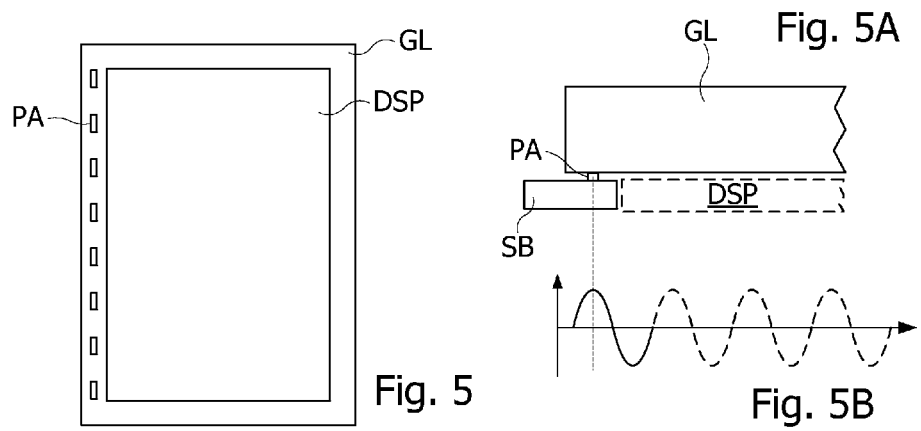

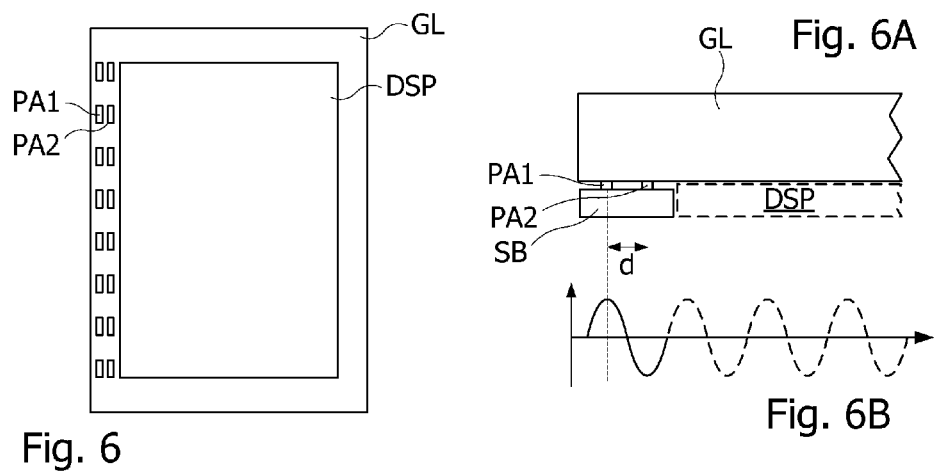
Fig. 6
Fig. 6A
Fig. 6B
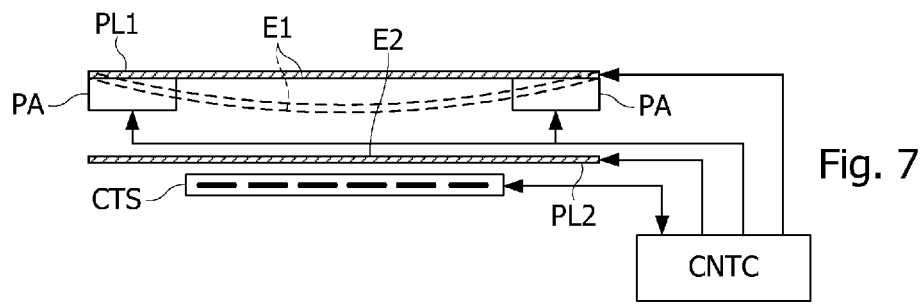
Fig. 7
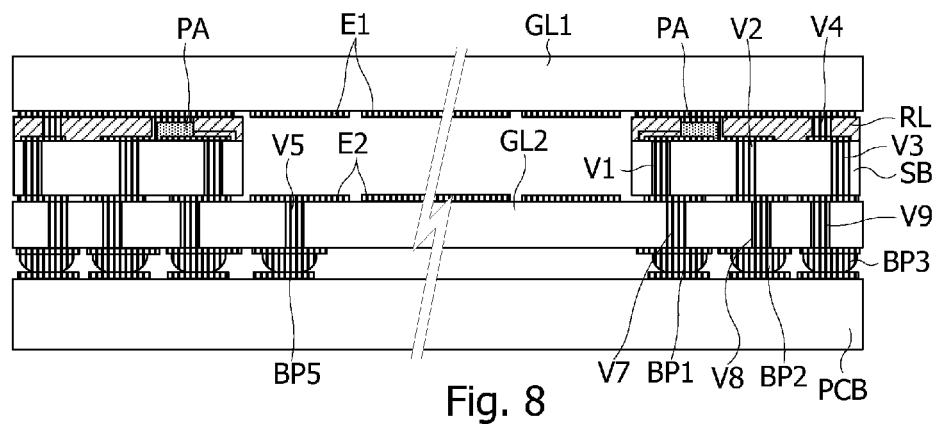
Fig. 8

METHOD OF MANUFACTURING A VIBRATORY ACTUATOR FOR A TOUCH PANEL WITH HAPTIC FEEDBACK

BACKGROUND

1. Technical Field

The present disclosure relates to a touch panel with haptic feedback, i.e., comprising a vibratory actuator able to transmit a vibration to the touch panel, in particular when activating a command using the touch panel. The present disclosure relates to any type of touch panel associated or not to a display screen.

The present disclosure applies in particular to terminals provided with a touch panel, such as mobile phones, personal digital assistants (PDA), global positioning systems (GPS), readers of multimedia files, control interfaces for computers.

2. Description of the Related Art

Touch panels using haptic feedback comprise one or more vibratory actuators which are excited by an electrical signal when the terminal detects the input of a command by the user using the touch panel. A vibration is thus transmitted to the user to indicate that his/her command has been acknowledged.

The vibratory actuators commonly used in touch panels using haptic feedback are discrete components of piezoelectric, electromagnetic or electrostatic type, which are mechanically coupled, directly or indirectly, to a plate forming the touch panel, where the user puts the finger or a stylus. The result is that some dimensions may be an issue in a small mobile terminal such as a phone, in particular when the touch panel is associated with a display. Indeed, the vibratory elements cannot be arranged in front of the display and there is often little room left around the display in the mobile terminal. The result is also that manufacturing and integration costs may be not negligible.

In mobile terminals, the vibratory actuators of piezoelectric type are preferred due to their lower electrical consumption. In a mobile phone comprising a touch display screen, the vibratory actuators are generally arranged around the display screen and make the entire phone vibrate, which results in a significant loss of energy which reduces the autonomy of the mobile phone.

BRIEF SUMMARY

It is therefore desirable to provide a small vibratory actuator, which may easily be integrated into a mobile terminal providing only a small space to house such an actuator. It is also desirable to provide a vibratory actuator which is little demanding in electrical energy consumed, and which is able to transmit a vibration to a touch panel with high efficiency.

Embodiments relate to a method of manufacturing vibratory elements, comprising forming on a substrate a multilayer structure by an integrated circuit manufacturing method, the multilayer structure comprising an element susceptible of vibrating when it is subjected to an electrical signal, and electrodes for transmitting an electrical signal to the vibratory element, the vibratory element comprising a mechanical coupling face whereby it is able to transmit to a control element vibrations perceptible by a user.

According to an embodiment, the method comprises forming on the substrate several multilayer structures, simultaneously, each multilayer structure comprising an element susceptible of vibrating when it is subjected to an electrical signal, and electrodes for transmitting an electrical signal to the vibratory element.

According to another embodiment, the method comprises forming a via going through the substrate to electrically link at least one of the electrodes of each vibratory element to a rear face of the substrate, each vibratory element being formed on a front face of the substrate, opposite to the rear face.

According to an embodiment, the vibratory element is formed by depositing onto the substrate and etching a layer in a piezoelectric material, the substrate being in a semiconductor or electrically insulating material.

According to an embodiment, the method comprises forming in the substrate a vibration sensor comprising a rod susceptible of being subjected to vibrations and distortion sensors for detecting the distortion of the substrate, formed on the substrate around the rod.

According to an embodiment, each distortion sensor comprises a pad in a piezoelectric material.

According to an embodiment, the top of the rod is in contact with the control element.

Embodiments also relate to a method of manufacturing a touch panel comprising a plate, the method comprising manufacturing steps in accordance with the previously defined manufacturing method, and mechanically coupling each vibratory element to the plate of the touch panel.

Embodiments also relate to a method of manufacturing a display screen with a touch panel comprising a plate, the method comprising manufacturing steps of vibratory elements in accordance with the previously defined manufacturing method, and mechanically coupling each vibratory element to the plate of the display screen.

According to an embodiment, the vibratory elements are formed on the substrate along a line, the substrate being arranged so that the line of vibratory elements is aligned along an edge of the display screen.

According to an embodiment, the vibratory elements are formed on the substrate along two parallel lines, the substrate being arranged so that the two parallel lines are aligned along an edge of the display screen, the two parallel lines being spaced out from one another by a distance such that the width of the plate in a direction perpendicular to the two parallel lines is equal to a multiple of twice the distance between the two lines.

Embodiments also relate to a vibratory device comprising a vibratory element obtained by the previously defined manufacturing method.

According to an embodiment, each vibratory element comprises a block in a piezoelectric material, such as PZT.

According to an embodiment, the vibratory device comprises several aligned vibratory elements.

According to an embodiment, the vibratory device comprises several vibratory elements aligned along two parallel lines.

Embodiments also relate to a terminal comprising a touch panel of capacitive or resistive type, a plate on which a user may put the finger to excite the touch panel, and a vibratory device as previously defined, the vibratory device being mechanically coupled to the plate.

According to an embodiment, the terminal comprises a vibration sensor, and a process unit configured to generate texture data from signals supplied by the vibration sensor and to reproduce a texture according to the texture data using the vibratory device.

Embodiments also relate to a terminal comprising a display screen associated with a touch panel of capacitive or resistive type, a transparent plate arranged on the display screen and on which a user may put the finger to excite the touch panel, and a vibratory device as previously defined, the vibratory device being mechanically coupled to the plate.

According to an embodiment, the terminal is configured to excite each vibratory element so as to generate in the plate standing wave or resonance vibratory conditions.

Embodiments also relate to a mobile terminal as previously defined.

BRIEF DESCRIPTION OF THE SEVERAL VIEWS OF THE DRAWINGS

Embodiments will be described hereinafter, in relation with, but not limited to the appended figures wherein:

FIG. 3 shows in cross-section an example of integration of the vibratory actuator in a touch panel of capacitive type;

FIG. 4 shows in cross-section an example of integration of the vibratory actuator in a touch panel of resistive type;

FIG. 5 shows a display screen with a touch panel, provided with vibratory actuators, according to one embodiment;

FIG. 5A is a partial section view of the display screen of FIG. 5;

FIG. 5B shows a vibratory signal applied to the display screen by the vibratory actuators;

FIG. 6 shows a display screen with a touch panel, provided with vibratory actuators, according to another embodiment;

FIG. 6A is a partial section view of the display screen of FIG. 6;

FIG. 6B shows a vibratory signal applied to the display screen by the vibratory actuators;

FIG. 7 schematically shows in cross-section a touch panel comprising a vibratory device, according to one embodiment;

FIGS. 8 to 11 schematically show in cross-section a touch panel provided with vibratory actuators, according to various embodiments;

DETAILED DESCRIPTION

Figure 1:
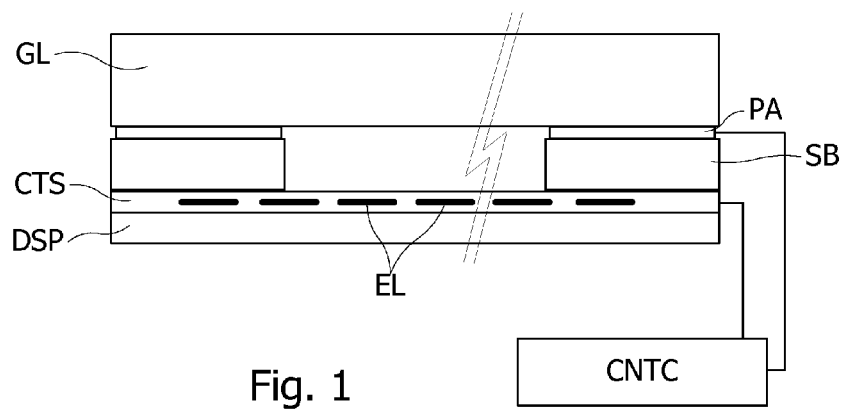
FIG. 1 schematically shows in cross-section a display screen provided with a touch panel and a vibratory actuator, according to one embodiment.

FIG. 1 shows a display screen, according to one embodiment. The display screen has a multilayer structure comprising a display DSP, for example a liquid crystal display. The display DSP is covered by a transparent touch panel layer CTS, comprising touch sensitive electrodes EL, also transparent, distributed in the layer CTS. The edges of the layer CTS are covered by one or more substrates SB on which vibratory actuators PA are formed. A plate GL in a transparent material, such as glass is arranged on the actuators PA and covers the layer CTS and the display DSP. The vibratory actuators PA and the touch panel CTS are controlled by a control circuit CNTC connected to the electrodes EL and the vibratory elements PA. The circuit CNTC is configured to detect the position or move of a finger or stylus on the surface of the plate GL, to determine from the position or move detected if a command is thus operated, and to control the actuators PA so as to emit a vibration if a command is operated.

According to one embodiment, the vibratory actuators PA are formed on a wafer by using integrated circuit manufacturing techniques, and in particular techniques of micro photolithography, and micro etching. The wafer is also cut into the substrates SB. The wafer may be a semiconductor material, but not necessarily. Thus, the wafer may be silicon, or any electrically insulating material which complies with integrated circuit manufacturing techniques, and with the temperatures used by the different processes of forming a vibratory actuator described below.

Figure 2A:
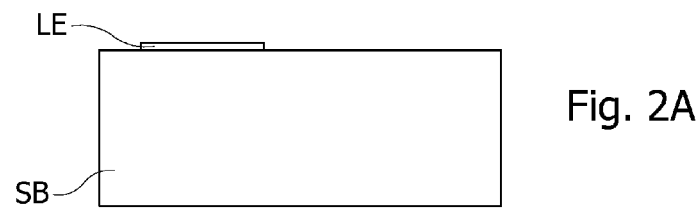
FIGS. 2A to 2G are section views of a substrate, at different manufacturing steps of a vibratory actuator, according to one embodiment.

Thus, FIGS. 2A to 2G show in cross-section a substrate SB at different manufacturing steps of one or more vibratory actuators. In FIG. 2A, one or more conductive paths each forming a lower electrode LE of a vibratory element and a connection path to the electrode LE, are formed on the substrate SB. Each electrode LE may be made conventionally by depositing a metal layer, for example in gold or titanium by sputtering on the substrate SB. A layer of photoresist is then deposited onto the metal layer, then a mask pattern is transferred to the photosensitive layer, and the exposed parts of the metal layer are removed.

Figure 2B:
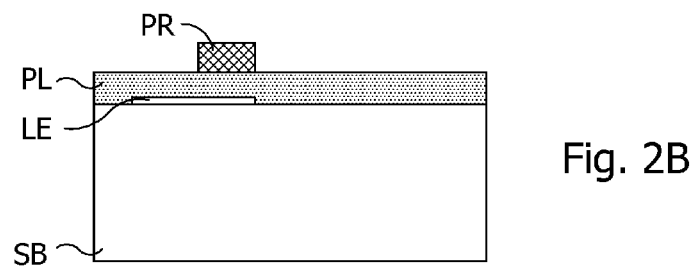
Figure 2C:
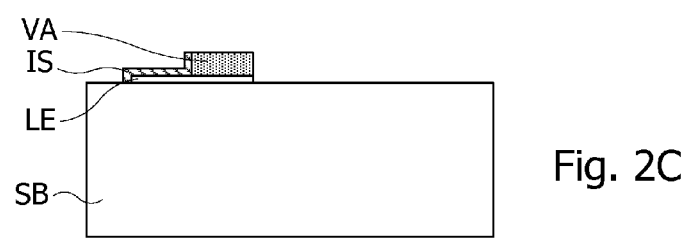

In FIG. 2B, a layer PL in a material susceptible of vibrating under the effect of an electrical signal, for example a piezoelectric material, is deposited onto the substrate SB. The piezoelectric material is for example a piezoelectric material such as a piezoelectric oxide like PZT (Lead Zirconate Titanate-$Pb(Zr_xTi_{1-x})O_3$), lead titanate ($PbTiO_3$), or barium titanate ($BaTiO_3$). This material may be deposited onto the substrate SB using a SOL-GEL process by rotating the substrate, and applying to the layer thus deposited annealing progressively reaching 700° C. for PZT. A layer of photoresist PR is then deposited onto the substrate SB, and a mask pattern is transferred to the layer PR. The mask pattern allows parts of the layer PL to be removed. Removing the layer PL is for example performed by inductively coupled plasma ICP. The layer PR is then removed. There is then only a block VA of piezoelectric material left, on each lower electrode LE (FIG. 2C). The material forming each block VA is able to generate a vibration which is perceptible by a user, when the material is subjected to an electrical excitation.

In FIG. 2C, an electrically insulating layer IS may be deposited onto some parts of the conductive paths connected to the lower electrodes LE and the block VA. The layer IS may be deposited as previously, by depositing onto the substrate SB, an electrically insulating material, then a layer of photoresist, and by transferring to the photosensitive layer a mask pattern. The exposed parts of the insulating layer are then etched, and the photosensitive layer is then removed.

Figure 2D:
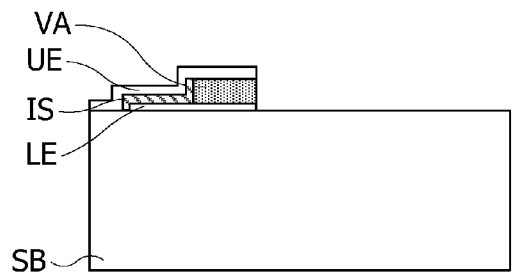

In FIG. 2D, an upper electrode UE of the vibratory element and a connection path to the upper electrode UE are formed on each block VA and on some parts of the insulating layer IS. The electrode UE and the connection path of the electrode UE may be formed as previously, for example by depositing a metal layer by sputtering and etching the metal layer. The metal used to form the electrode UE is for example chromium or nickel. The set consisting of the block VA, the electrodes LE, UE and the insulating layer IS between the connection paths of the electrodes LE, UE forms a vibratory element PA. It is to be noted that forming an insulating layer IS between the conductive connection paths of the two electrodes LE, UE may not be necessary, in particular if the conductive connection paths of the electrodes spread out on the substrate from two different sides of the block VA.

Figure 2E:
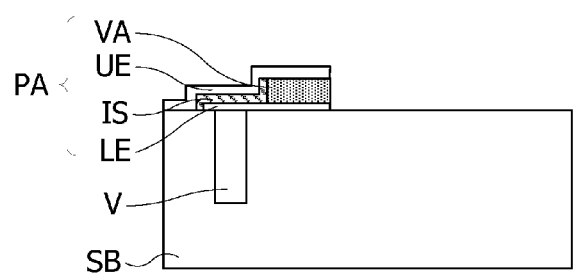
Figure 2F:
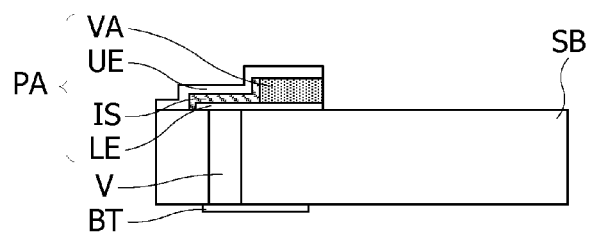

In FIGS. 2E and 2F, showing an embodiment, vias going through the substrate SB may be formed to electrically link to the rear face of the substrate SB, one and/or the other conductive connection path of the electrodes LE, UE of each vibratory element PA. To that end, a metalized hole V is formed in the substrate SB, in each conductive path to be linked to the rear face of the substrate (FIG. 2E). The substrate SB is then thinned, for example by mechanically grinding its rear face, until the metal deposited into each hole V appears on the rear face (FIG. 2F). Each metalized hole opening onto the rear face of the substrate SB thus forms a through-via V. In FIG. 2F, a routing conductive path BT linked to each through-via V, is formed on the rear face of the substrate SB. The substrate SB is then cut out to obtain separate substrates with vibratory actuators comprising one or more vibratory elements, for example arranged in rows.

Figure 2G:
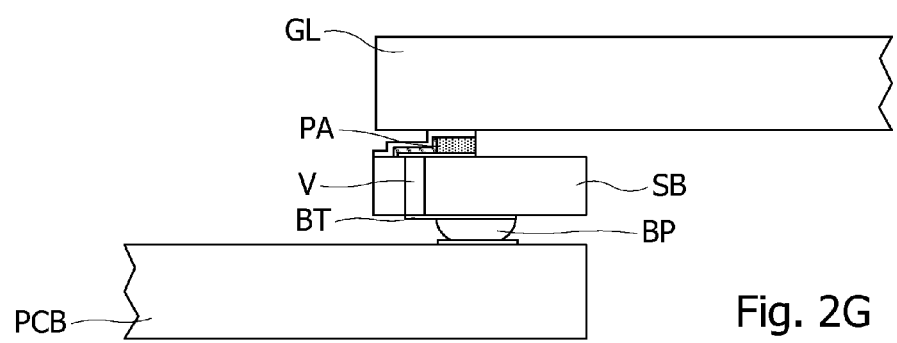

In FIG. 2G, the vibratory element PA on the substrate SB is mechanically coupled to a plate GL to be vibrated, for example using a layer of glue, and the path BT on the rear face of the substrate SB is welded by a connection ball BP on a board PCB, for example a printed circuit board or a substrate BGA (Ball Grid Array).

According to one embodiment, the plate GL is opaque and constitutes the upper surface of a touch panel.

According to another embodiment, the plate GL is transparent and is arranged above a display screen with a touch panel. Thus, in FIGS. 3 and 4, the two electrodes LE, UE of the vibratory element PA formed on the substrate SB, are linked to conductive paths BT1, BT2 through vias V1, V2 going through the substrate SB. The paths BT1, BT2 are connected to conductive paths formed on the board PCB through connection balls BP1, BP2 also performing fixing the substrate SB on the board PCB. In addition, the vibratory element PA is mechanically coupled to the plate GL.

In FIG. 3, the plate GL is associated with a plate of electrodes of touch panel CTS of capacitive type, arranged under the plate GL at a distance therefrom. The substrate SB may be housed between the plate GL and the touch panel CTS. In FIG. 4, the plate GL is associated with a touch panel RTS of resistive type, arranged on the plate GL.

According to one embodiment, the plate GL and the touch panel CTS (or RTS) are opaque and form a control touch panel.

According to another embodiment, the plates GL and the touch panel CTS (or RTS) are transparent and associated with a display DSP, for example a liquid crystal display, arranged under the touch panel CTS (FIG. 3) or under the plate GL (FIG. 4). The substrate SB may then be arranged between an edge of the touch panel CTS and an edge of the plate GL, so as not to hide a part of the display DSP. The board PCB may also be arranged so as not to hide a part of the display DSP as shown in FIGS. 3 and 4, for example facing the substrate SB.

FIG. 5 shows a display screen DSP covered by the transparent plate GL and associated with a touch panel as shown in FIG. 3 or 4. According to one embodiment, several vibratory actuators PA are arranged along an edge of the screen DSP along a line parallel to the edge of the screen DSP. FIG. 5A shows one of the vibratory actuators PA formed on the substrate SB. According to one embodiment, the actuators PA along the edge of the screen (FIG. 5) are all formed on the substrate SB.

FIG. 5B shows a sinusoidal curve in correspondence with the actuator PA shown in FIG. 5A. The curve of FIG. 5B shows that the actuator PA vibrates in a direction perpendicular to the plate GL. According to one embodiment, the actuator PA generates in the plate GL resonance or standing waves vibratory conditions. To that end, the width of the plate GL is a multiple of the wave length of the vibration generated by the element PA. Such standing wave vibratory conditions allow a stable vibratory phenomenon to be obtained and an air gap to be generated between the user's finger and the surface of the plate GL.

FIG. 6 shows a display screen DSP covered by the transparent plate GL and associated with a touch panel as shown in FIG. 3 or 4. According to one embodiment, vibratory actuators PA1, PA2 are arranged along an edge of the screen DSP along two lines parallel to the edge of the screen DSP. FIG. 6A shows two of the vibratory actuators PA1, PA2 respectively belonging to the two parallel lines of vibratory elements. According to one embodiment, the actuators PA1, PA2 along the edge of the screen DSP are all formed on the same substrate SB.

FIG. 6B shows a sinusoidal curve in correspondence with the actuators PA1, PA2 shown in FIG. 6A. The curve of FIG. 6B shows that the actuators PA1, PA2 vibrate in phase opposition. According to one embodiment, the actuators PA1, PA2 generate in the plate GL resonance or a standing wave vibratory conditions. To that end, the two lines of actuators are located on antinodes in phase opposition of the standing waves in resonance mode generated in the plate. This condition is met (like in the example of FIGS. 6A, 6B) when the width of the plate GL in the spacing direction of the two lines of actuators is a multiple of twice the distance d defined between the two parallel lines of elements PA1, PA2.

Admittedly, the arrangement of the vibratory elements PA, PA1, PA2 shown in FIGS. 5 and 6 may be applied to a touch panel not associated with a display.

FIG. 7 shows a touch panel device comprising a touch panel CTS associated with vibratory actuators PA. The vibratory actuators PA are mechanically coupled to a plate PL1 having an upper face on which a user may put or slide a finger. The actuators PA and the touch panel CTS are controlled by a control circuit CNTC. The circuit CNTC controls the touch panel CTS to detect and locate objects such as the user's finger on the upper face of the plate PL1.

According to one embodiment, the plate PL1 comprises one or more electrodes E1, and is associated with a lower plate PL2 on which an electrode E2 is formed facing each electrode E1. The electrodes E1, E2 facing each other are temporarily subjected by the circuit CNTC to a potential difference able to cause a local distortion of at least the plate PL1. This local distortion results from an electrostatic attractive force generated by the potential difference supplied to the electrodes E1, E2. The plate PL1 is susceptible of distorting with elasticity under the effect of the electrostatic forces thus generated. On the other hand, the plate PL2 may be more rigid than the plate PL1 insofar as it is not necessary for it to distort.

According to one embodiment, the circuit CNTC is configured to detect the position and/or moves of an object such as a finger on the plate PL1, and as a function of the position of the object detected on the plate PL1, trigger the vibratory actuators PA so as to emit vibrations and/or apply a potential difference to the electrodes E1, E2, so as to trigger a transversal move located at the external face of the plate PL1. Admittedly, the vibrations applied by the actuators PA and the movement generated by the electrodes to the plate PL1 have sufficient amplitudes to be perceptible by a user having a finger in contact with the plate PL1.

FIG. 8 shows a touch panel provided with vibratory actuators and electrodes to distort or locally move an upper plate on which a finger of the user may slide. The touch panel comprises an upper plate GL1 and a lower plate GL2. The plate GL1 has a lower face on which the electrodes E1 are formed. Vibratory actuators are interposed between the lower face of the plate GL1 and an upper face of the plate GL2. Each of the vibratory actuators is formed on a substrate SB and comprises a vibratory element PA arranged against the lower face of the plate GL1. The plate GL2 comprises electrodes E2 formed on its upper face in contact with the substrate SB of the vibratory actuators. Vias V1, V2, V3, V4 going through the substrate are provided to electrically link electrodes of the vibratory actuators and the electrodes E1 to connection pads formed on the lower face of the substrate SB. The plate GL2 also comprises through-vias V7, V8, V9, V5 to electrically link connection pads formed on the lower face of the substrate SB, as well as electrodes E2, to connection pads formed on the lower face of the plate GL2. The connection pads on the lower face of the plate GL2 may then be welded to conductive paths formed on a plate, such as a printed circuit board PCB for example by connection balls BP1, BP2, BP3, BPS. The printed circuit board PCB may be a substrate BGA (Ball Grid Array).

Figure 9:
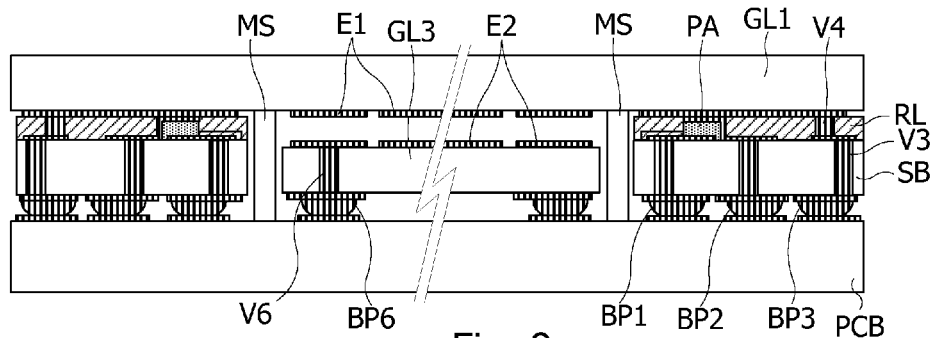

FIG. 9 shows a touch panel provided with vibratory actuators and electrodes, according to another embodiment. The touch panel of FIG. 9 differs from that of FIG. 8 in that the substrate SB on which each of the actuators PA are formed is directly connected to the printed circuit board PCB, for example through the connection balls BP1, BP2, BP3. The vias V3, V4 therefore directly electrically connect the electrodes E1 to the printed circuit board PCB. The electrodes E2 are formed on another plate GL3 arranged between the plate GL1 and the printed circuit board PCB and between the actuators PA. The electrodes E2 may be electrically linked to the printed circuit board PCB through vias V6 going through the plate GL3 and for example by connection balls BP6. Spacers MS may be provided to maintain the distance between the plate GL1 and the printed circuit board PCB near the actuators PA.

According to one embodiment, the electrodes E1, E2 are unique and therefore may cover the whole surface of the plate GL and of one or the other of the plates GL2, GL3, facing the touch panel. According to another embodiment, several electrodes E1, E2 are distributed on the surface of each plate GL1 and GL2 or GL3, facing the touch panel, so as to form pairs of electrodes E1, E2 facing each other. The pairs of electrodes E1, E2 may be controlled independently so as to obtain local distortions of the plate GL1, as a function of object positions detected by the touch panel on the plate GL1. The vibratory actuators PA then comprise enough vias V3, V4 to perform independent connections of the electrodes E1 to the printed circuit board PCB. In addition, in the embodiment of FIG. 8, the plate GL2 comprises enough vias V5, V9 to perform independent connections of the electrodes E2 and E1 to the printed circuit board PCB. In the embodiment of FIG. 9, the plate GL3 comprises enough vias V6 to perform independent connections of the electrodes E2 to the printed circuit board PCB.

It is to be noted that it is not necessary that the electrodes are formed on faces of the plates GL1, GL2 or GL3 facing each other. The electrodes may indeed be formed on the other faces of the plates GL1, GL2, GL3 without significantly affecting the electrostatic forces susceptible of being generated by the electrodes, since the electrodes of each pair of electrodes are formed facing each other or have at least respective parts facing each other.

According to one embodiment, the electrodes E1 and/or E2 may be the electrodes of the touch panel used to detect and locate objects on the plate GL1. The control circuit CNTC may then be configured to use the electrodes E1 and/or E2 so as to detect and locate an object on the upper face of the plate GL1, and in particular to generate a detection signal by demodulating or filtering signals supplied by the electrodes E1 and/or E2, using the signals supplied to the electrodes to generate the electrostatic forces.

Figure 10:
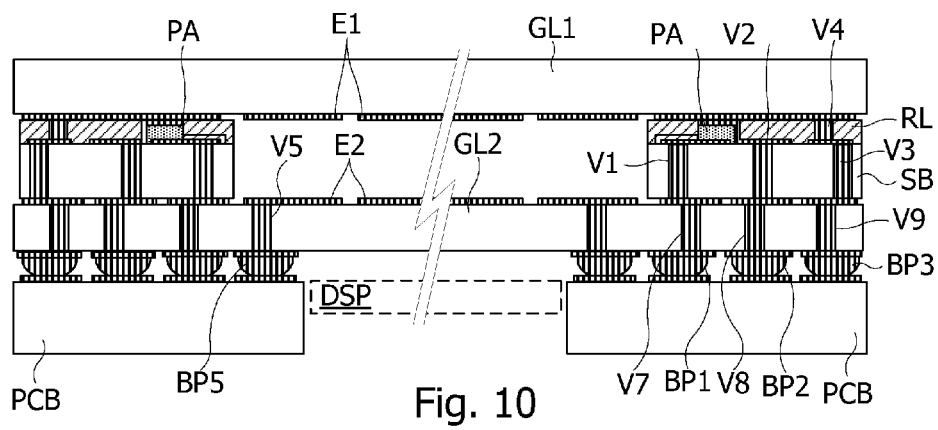
Figure 11:
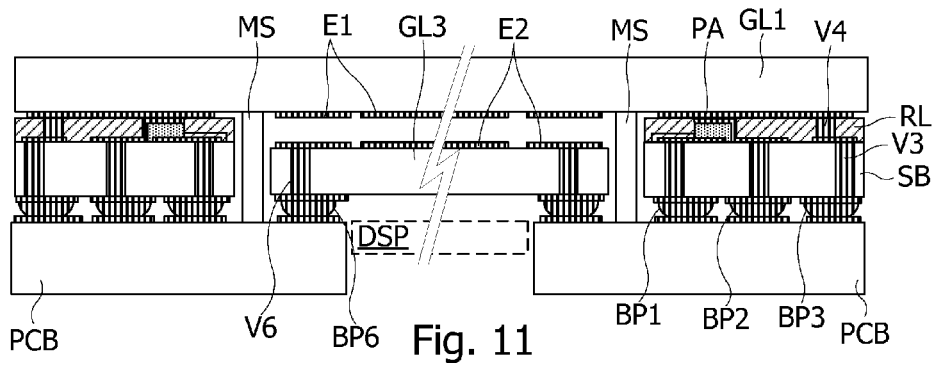

According to embodiments, the touch panel is associated with a display, for example a liquid crystal display. In this case, the plates GL1, and GL2 or GL3, as well as the electrodes E1, E2 are transparent. The printed circuit board PCB comprises a central window opposite to which are arranged the display, and the touch panel if it comprises electrodes different from the electrodes E1, E2. Thus, FIG. 10 shows a touch panel which differs from that of FIG. 8 in that the printed circuit board PCB has a central window in which a display DSP is arranged. FIG. 11 shows a touch panel which differs from that of FIG. 9 in that the printed circuit board PCB has a central window in which the display DSP is arranged. In FIGS. 10 and 11, all the vias V1 to V9 are arranged around the display DSP.

According to one embodiment, the vibratory actuators PA are formed on a wafer by using integrated circuit manufacturing techniques, and in particular techniques of micro photolithography, and micro etching. The wafer is also cut into the substrates SB. The wafer may be a semiconductor material, but not necessarily. Thus, the wafer may be silicon, or any electrically insulating material which complies with integrated circuit manufacturing techniques, and with the temperatures used by the different processes to form a vibratory actuator described below.

Figure 12A:
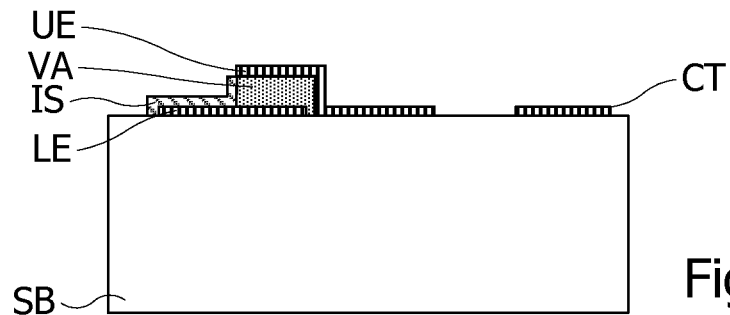
FIGS. 12A to 12C are section views of a wafer, at different manufacturing steps of a vibratory actuator, according to one embodiment.
Figure 12B:
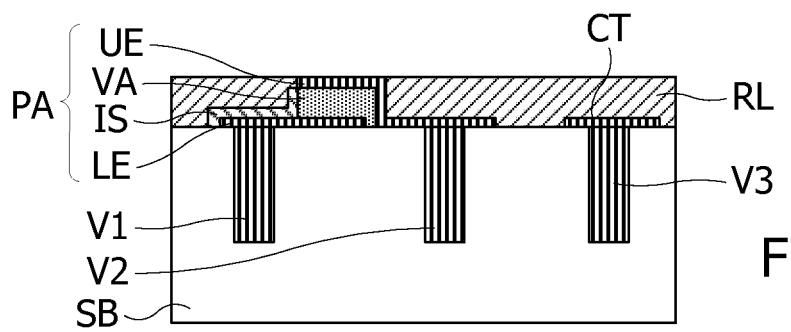
Figure 12C:
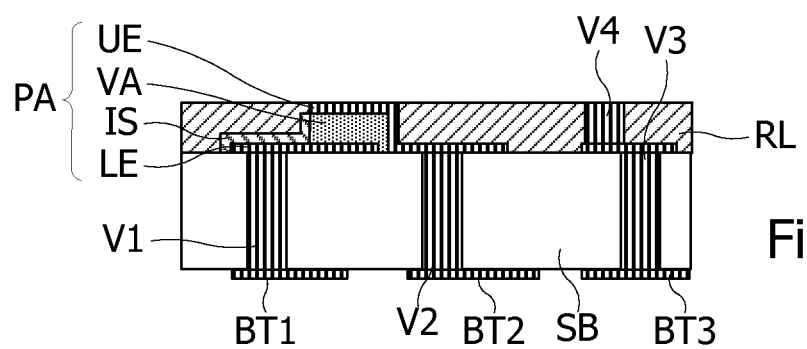

Thus, FIGS. 12A to 12C show in cross-section a substrate SB at different manufacturing steps of a vibratory actuator, from step shown in FIG. 2C. In FIG. 12A, an upper electrode UE of the vibratory element and a connection path of the electrode UE are formed on each block VA and on some parts of the insulating layer IS. The electrode UE and the connection path of the electrode UE may be formed as previously, for example by depositing a metal layer by sputtering and etching the metal layer. The metal used to form the electrode UE is for example chromium or nickel. The set consisting of the block VA, the electrodes LE, UE and the insulating layer IS between the connection paths of the electrodes LE, UE forms a vibratory element PA. It is to be noted that forming an insulating layer IS between the conductive connection paths of the two electrodes LE, UE may not be necessary, in particular if the conductive connection paths of the electrodes spread out on the wafer from two different sides of the block VA. One or more conductive paths CT, each to connect an electrode E1, may be formed at the same time as the electrode UE.

In FIGS. 12B and 12C, vias going through the substrate SB may be formed to electrically link to the lower face of the substrate SB, one and/or the other conductive connection path of the electrodes LE, UE of each vibratory element PA, as well as the connection paths CT of the electrodes E1, formed on the upper face of the substrate SB. To that end, metalized holes V1, V2, V3 are formed in the substrate SB, in each conductive path to be linked to the rear face of the substrate (FIG. 12B). The upper face of the substrate SB may be covered by a photoresist layer so as to form a substantially plane surface provided to be applied against the lower face of the plate GL1. To guarantee the connection of the electrodes E1, the photoresist layer is etched so as to form therein a hole to a pad electrically linked to the vias V1, V2, V3. The hole is then filled with an electrically conductive material.

The substrate SB is then thinned, for example by mechanically grinding its lower face, until the metal deposited into each hole appears on the lower face of the substrate SB (FIG. 12C). Each metalized hole opening onto the rear face of the substrate SB thus forms a through-via V1, V2, V3. In FIG.

12C, routing conductive paths BT1, BT2, BT3 linked to the through-vias V1, V2, V3, are formed on the lower face of the substrate SB. The substrate SB may then be cut out to obtain vibratory actuators comprising one or more vibratory elements VA, for example arranged in rows.

The electrodes E1, E2 may also be formed on plates GL1, GL2, GL3 by conventional photolithography and etching techniques, used to manufacture integrated circuits, whether the plates are opaque or transparent, for example in glass. If the electrodes E1, E2 are transparent, they may be made in indium tin oxide ITO.

Figure 13:
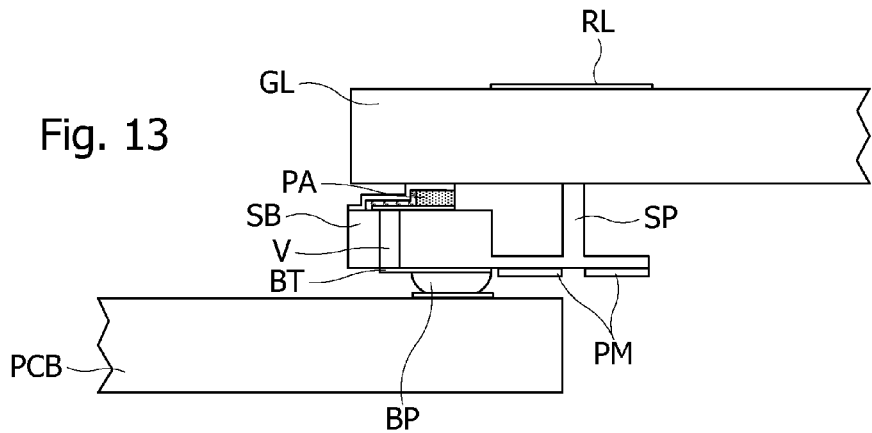
FIG. 13 shows in cross-section a substrate associating a vibratory actuator to a vibration sensor, according to another embodiment.

FIG. 13 shows the substrate SB comprising one or more of the vibratory actuators PA. According to one embodiment, the vibratory actuator PA is associated with a vibration sensor also formed in the substrate SB. The vibration sensor comprises a rod SP formed in the substrate SB and spreading out perpendicularly to the substrate from the upper or front face thereof. The rod SP has a top which may be plane, provided to be mechanically coupled by contact, to a plate such as the plate GL in which the vibrations are to be detected. The rod SP may have a circular or square cross section. The rear face of the substrate SB around the base of the rod SP comprises sensors PM able to detect distortions of the substrate due to the top of the rod SP tilting around the base thereof.

Figure 13A:
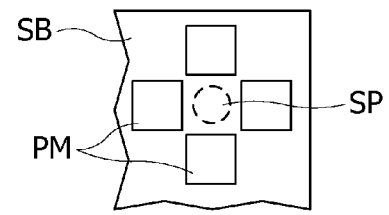
FIG. 13A is a bottom view of the part of the substrate into which is formed the vibration sensor.

As shown in FIG. 13A, the sensors PM may have the shape of pads formed in a layer in a material able to produce an electrical signal when it is subjected to a mechanical constraint. This material is for example a piezoelectric material such as that used to form the actuators PA. In the example of FIG. 13A, there are four sensors PM of square shape, to detect the tilting of the rod SP about two perpendicular axes, parallel to the plane of the substrate SB, when two of the sensors PM detect distortions of the substrate which are inverse from one another, and axial moves of the rod when the four sensors detect distortions of the substrate in a same direction.

The vibration sensor may thus be used to detect textures of objects, by rubbing them on the plate GL above the rod SP. The detection sensitivity of an object texture may be increased by increasing the roughness of the plate GL above the rod SP. To that end, a pad RL having a higher roughness than that of the upper face of the plate GL may be glued thereon above the rod SP.

The vibration sensor may thus be connected to a data processing unit also connected to the actuators PA, such as the control unit CNTC. The process unit may be programmed to generate from a signal supplied by the vibration sensor, texture data which may be memorized in a texture file. The process unit may also be programmed to control the actuators PA according to the data stored in such a texture file so as to reproduce the texture detected by the vibration sensor, when the user slides his/her finger on the plate GL.

Figure 14A:
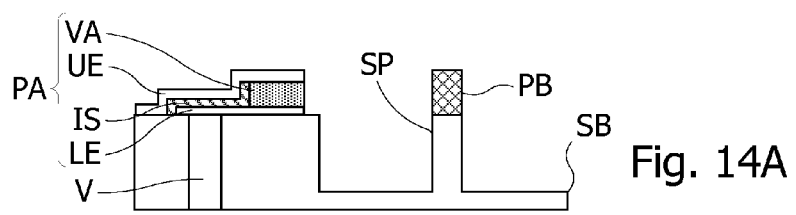
FIGS. 14A and 14B are section views of a substrate, at different manufacturing steps of a vibratory actuator associated with a vibration sensor, according to one embodiment.
Figure 14B:
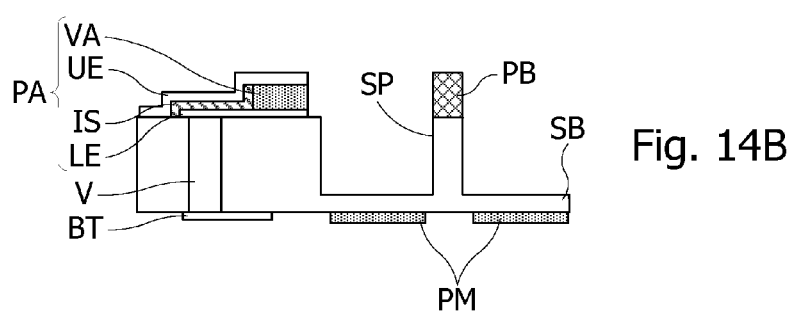

FIGS. 14A, 14B show manufacturing steps of a vibratory element and a vibration sensor on the same substrate SB. The manufacturing step shown by FIG. 14A may be made after the step of thinning the substrate SB, shown by FIG. 2F or 12C. This manufacturing step consists in making the rod SP by forming in the substrate SB from its front face, a cavity around the rod SP. This operation may be made by depositing a photoresist layer to which a mask pattern is transferred, then by an etching process such as DRIE (Deep Reactive Ion Etching). The cavity may then be filled with a polymer. The substrate SB after thinning (FIG. 2F or 12C) may have a thickness around 100 μm. The rod SP may have a length and diameter or width around 10 to 20 μm.

For the plate GL to be in contact simultaneously with the top of the rod SP and the actuators PA, an additional layer PB may be deposited at the top of the rod SP. The layer PB may come from the photoresist layer used to form the rod SP.

At a following manufacturing step shown by FIG. 14B, the material forming the distortion sensors PM is deposited then etched to form the pads, on the lower face of the substrate SB around the base of the rod SP. In a following step, electrical connections of the pads are formed by depositing and etching a metal layer. This step of forming electrical connections may be made at the same time as the routing conductive paths BT.

Admittedly, it is not necessary that the rod SP is mechanically coupled to the same plate as that (GL) in contact with the vibratory actuators PA. Indeed, the rod SP may be coupled to another plate susceptible of being subjected to vibrations to be detected.

It will be clear to those skilled in the art that the present disclosure is susceptible of various embodiments and applications. In particular, the disclosure is not limited to the use of a piezoelectric material to make the vibratory elements. Other vibratory elements may indeed fit in the target applications. Thus, each vibratory element may be made by forming on the substrate SB, a coil either perpendicular or parallel to the substrate, the inside of the coil being filled with a material with high magnetic permittivity, such as NiCr, CoFe or a permalloy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first multilayer structure on a substrate having semiconductor material, the forming of the first multilayer structure including:
   forming on a first surface of the substrate a first electrode;
   forming on the first electrode a first vibratory element configured to vibrate in response to a first electrical signal;
   coupling the first vibratory element to a first plate to vibrate the first plate as the first vibratory element vibrates;
   forming a second electrode having first and second portions, the first vibratory element being positioned between the first portion and the first electrode, the second portion being formed on the first surface of the substrate and being coplanar with the first electrode, the first and second electrodes being configured to transmit the first electrical signal to the first vibratory element;
   forming first and second vias through the semiconductor material of the substrate; and
   electrically coupling the first and second electrodes to a second surface of the substrate though the first and second vias, respectively.

2. The method according to claim 1, further comprising:
   forming a second multilayer structure on the substrate, the forming of the second multilayer structure including:
   forming on the first surface of the substrate a second vibratory element configured to vibrate in response to a second electrical signal; and forming on the first surface of the substrate third and fourth electrodes configured to transmit the second electrical signal to the second vibratory element.

3. The method according to claim 1, wherein forming the first vibratory element includes depositing onto the substrate a piezoelectric material layer and etching the piezoelectric material layer.

4. The method according to claim 1, further comprising forming a vibration sensor, the forming of the vibration sensor including:
    forming a rod configured to respond to vibrations; and
    forming distortion sensors on the substrate and positioned around the rod, the distortion sensors configured to detect a distortion of the substrate.

5. The method according to claim 4, wherein forming each distortion sensor includes forming a pad of piezoelectric material.

6. The method according to claim 5, further comprising forming a top for the rod that is in contact with the first plate.

7. The method according to claim 4, wherein forming the rod includes removing portions of the substrate.

8. The method according to claim 1, wherein forming the first multilayer structure includes coupling the first vibratory element to a touch panel.

9. The method according to claim 2, further comprising:
    coupling the second vibratory element to the first plate; and
    coupling the first and second vibratory elements to a display screen and a touch panel.

10. The method according to claim 9, further comprising:
    aligning the first vibratory element with the second vibratory element along a first axis that extends from an edge of the display screen, the first vibratory element being positioned between the edge of the display screen and the second vibratory element.

11. The method according to claim 10, further comprising:
    forming third and fourth vibratory elements on the substrate;
    aligning the third vibratory element with the fourth vibratory element along a second axis that extends from the edge of the display screen, the third vibratory element being closer to the edge of the display screen than the fourth vibratory element is to the edge of the display screen;
    aligning the third and fourth vibratory elements with the first and second vibratory elements along a third and fourth axes, respectively, the third axis being substantially parallel with the fourth axis and substantially parallel with the edge of the display screen, the third and fourth axes being spaced apart by a distance.

12. The method according to claim 10, wherein the first and second vibratory elements are spaced apart by a distance, and a width of the first plate, in a direction that is perpendicular to the edge of the display screen, is approximately equal to a multiple of twice the distance.

13. The method according to claim 1, further comprising:
    forming a third electrode on the first plate;
    forming a fourth electrode on a second plate;
    positioning the third and fourth electrodes to face each other; and
    coupling a control circuit to the first and second plates and to the first, second, third, and fourth electrodes, the control circuit being configured to detect a position or movement of an object on the first plate.

14. The method of claim 13, wherein the control circuit is configured to vibrate the first vibratory element and is further configured to apply a potential difference to the third and fourth electrodes to generate a transverse movement in the first plate.

15. The method according to claim 13, further comprising:
    coupling a display to the first and second plates and to the first, second, third, and fourth electrodes, the first and second plates and the third and fourth electrodes being transparent.

16. The method according to claim 13, further comprising:
    forming third and fourth vias through the second plate; and
    electrically coupling the first and second vias to the third and fourth vias, respectively.

17. The method according to claim 16, further comprising:
    electrically coupling the third and fourth vias to a printed circuit board; and
    electrically coupling the first and second electrodes to the printed circuit board through the first, second, third, and fourth vias.

18. The method according to claim 13, further comprising:
    coupling a second vibratory element to the first plate, the second vibratory element being laterally spaced from the first vibratory element, the third electrode on the first plate being positioned between the first and second vibratory elements.

19. The method according to claim 1, wherein forming the first multilayer structure includes forming an insulating layer on the first electrode, and forming the second electrode includes forming a third portion of the second electrode on the insulating layer.

20. The method according to claim 1, wherein the first electrode extends from a first side of the first vibratory element and along the first surface of the substrate, and the second portion of the second electrode is on a second side of the first vibratory element.

21. A vibratory device, comprising:
    a substrate including semiconductor material;
    a first multilayer structure formed on the substrate, the first multilayer structure including:
        a first electrode on a first surface of the substrates;
        a first vibratory element on the first electrode, the first vibratory element being configured to vibrate in response to a first electrical signal, the first vibratory element being coupled to a first plate to vibrate the first plate as the first vibratory element vibrates;
        a second electrode having first and second portions, the first vibratory element being positioned between the first portion and the first electrode, the second portion being on the first surface of the substrate and being coplanar with the first electrode, the first and second electrodes being configured to transmit the first electrical signal to the first vibratory element; and
    first and second vias through the semiconductor material of the substrate, the first and second electrodes being electrically coupled to a second surface of the substrate through the first and second vias, respectively.

22. The vibratory device according to claim 21, wherein the first vibratory element includes a piezoelectric material.

23. The vibratory device according to claim 21, further comprising:
    a second multilayer structure spaced apart from the first multilayer structure on the substrate, the second multilayer structure including:
        a second vibratory element on the first surface of the substrate, the second vibratory element configured to vibrate in response to a second electrical signal, the second vibratory element being configured to be coupled to the first plate; and third and fourth electrodes configured to transmit the second electrical signal to the second vibratory element.

24. The vibratory device according to claim 23, further comprising:
third and fourth vibratory elements, the first and second vibratory elements being aligned with each other along a first line in a first direction, the third and fourth vibratory elements being aligned with each other along a second line in the first direction, the third vibratory element being aligned with the first vibratory element along a third line in a second direction, and the fourth vibratory element being aligned with the second vibratory element along a fourth line in the second direction, the second direction being substantially perpendicular to the first direction.

25. The vibratory device according to claim 21, further comprising:
a second plate;
a third electrode on the first plate;
a fourth electrode on the second plate, the third and fourth electrodes facing each other; and
a control circuit coupled to the first, second, third, and fourth electrodes, the control circuit being configured to detect an input by the user on the first plate, to vibrate the first vibratory element, and to apply a potential difference to the third and fourth electrodes to generate a transverse movement in the first plate in response to the input.

26. The vibratory device according to claim 25, further comprising a display coupled to the first and second plates and to the third and fourth electrodes, wherein the first and second plates and the third and fourth electrodes are transparent.

27. The vibratory device according to claim 21, wherein the first multilayer structure includes an insulating layer on the first electrode, and the second electrode includes a third portion on the insulating layer.

28. The vibratory device according to claim 21, wherein the first electrode extends from a first side of the first vibratory element and along the first surface of the substrate, and the second portion of the second electrode is on a second side of the first vibratory element.

29. A system, comprising:
a touch panel;
a first plate configured to receive an input from a user, the first plate being coupled to the touch panel; and
a vibratory device coupled to the first plate, the vibratory device including:
a first multilayer structure formed on a substrate having semiconductor material, the first multilayer structure including:
a first electrode on a first surface of the substrate:
a first vibratory element on the first electrode, the first vibratory element being configured to vibrate in response to an electrical signal, and the first vibratory element being coupled to the first plate to vibrate the first plate as the first vibratory element vibrates;
a second electrode having first and second portions, the first vibratory element being positioned between the first portion and the first electrode, the second portion being on the first surface of the substrate and being coplanar with the first electrode, the first and second electrodes being configured to transmit the electrical signal to the first vibratory element; and
first and second vias through the semiconductor material of the substrate, the first and second electrodes being electrically coupled to a second surface of the substrate through the first and second vias, respectively.

30. The system according to claim 29, wherein the first electrode extends from a first side of the first vibratory element and along the first surface of the substrate, and the second portion of the second electrode is on a second side of the first vibratory element.

31. The system according to claim 29, further comprising:
a vibration sensor configured to generate signals in response to the input from the user;
a process unit configured to generate texture data from the signals from the vibration sensor and further configured to reproduce a texture response based on the texture data using the vibratory device.

32. The system according to claim 29, wherein the first plate is transparent, and the system further includes a display screen that is coupled to the touch panel and the first plate.

33. The system according to claim 29, further comprising:
a control circuit configured to excite the first vibratory element to generate standing wave or resonance vibratory conditions in the first plate.

34. The system of claim 29, further comprising:
a second plate;
a third electrode on the first plate;
a fourth electrode on the second plate, the third and fourth electrodes facing each other; and
a control circuit coupled to the first, second, third, and fourth electrodes, the control circuit being configured to detect an input by the user on the first plate, to vibrate the first vibratory element, and to apply a potential difference to the third and fourth electrodes to generate a transverse movement in the first plate in response to the input.

35. The system of claim 34, wherein the first and second plates and the third and fourth electrodes are transparent.

36. The system of claim 34, further comprising:
a display; and
a printed circuit board having an opening, the display being arranged in the opening, and the second plate being positioned above the opening.

37. A method, comprising:
forming a first multilayer structure on a substrate having semiconductor material, the forming of the first multilayer structure including:
forming on a first surface of the substrate a first vibratory element configured to vibrate in response to a first electrical signal;
coupling the first vibratory element to a first plate to vibrate the first plate as the first vibratory element vibrates; and
forming on the first surface of the substrate first and second electrodes configured to transmit the first electrical signal to the first vibratory element;
forming a first via through the semiconductor material of the substrate; and
electrically coupling the first electrode to a second surface of the substrate though the first via; and
forming a vibration sensor, the forming of the vibration sensor including:
forming a rod configured to respond to vibrations; and
forming distortion sensors on the substrate and positioned around the rod, the distortion sensors configured to detect a distortion of the substrate.

38. The method according to claim 37, wherein forming each distortion sensor includes forming a pad of piezoelectric material.

39. A method, comprising:
   forming a first multilayer structure on a substrate having semiconductor material, the forming of the first multilayer structure including:
      forming on a first surface of the substrate a first vibratory element configured to vibrate in response to a first electrical signal;
      coupling the first vibratory element to a first plate to vibrate the first plate as the first vibratory element vibrates; and
      forming on the first surface of the substrate first and second electrodes configured to transmit the first electrical signal to the first vibratory element;
      forming a first via through the semiconductor material of the substrate; and
      electrically coupling the first electrode to a second surface of the substrate though the first via;
   forming a third electrode on the first plate;
   forming a fourth electrode on a second plate;
   positioning the third and fourth electrodes to face each other; and
   coupling a control circuit to the first and second plates and to the first, second, third, and fourth electrodes, the control circuit being configured to detect a position or movement of an object on the first plate.

40. The method of claim 39, wherein the control circuit is configured to vibrate the first vibratory element and is further configured to apply a potential difference to the third and fourth electrodes to generate a transverse movement in the first plate.

41. A vibratory device, comprising:
   a substrate including semiconductor material;
   a first plate;
   a second plate;
   a first multilayer structure formed on the substrate, the first multilayer structure including:
      a first vibratory element on a first surface of the substrate, the first vibratory element configured to vibrate in response to a first electrical signal, the first vibratory element being coupled to the first plate to vibrate the first plate as the first vibratory element vibrates;
      first and second electrodes on the first surface of the substrate, the first and second electrodes configured to transmit the first electrical signal to the first vibratory element; and
      a via through the semiconductor material of the substrate, the first electrode being electrically coupled to a second surface of the substrate through the via;
   a third electrode on the first plate;
   a fourth electrode on the second plate, the third and fourth electrodes facing each other; and
   a control circuit coupled to the first, second, third, and fourth electrodes, the control circuit being configured to detect an input by the user on the first plate, to vibrate the first vibratory element, and to apply a potential difference to the third and fourth electrodes to generate a transverse movement in the first plate in response to the input.

42. The vibratory device according to claim 41, further comprising a display coupled to the first and second plates and to the third and fourth electrodes, wherein the first and second plates and the third and fourth electrodes are transparent.

* * * * *